(12) United States Patent
Sun et al.

(10) Patent No.: US 12,712,503 B2
(45) Date of Patent: Aug. 18, 2026

(54) NOISE CANCELLATION CIRCUIT

(71) Applicant: Apple Inc., Cupertino, CA (US)

(72) Inventors: Tao Sun, Cupertino, CA (US); Karthikeyan Reddy, Cupertino, CA (US); Hyunsik Park, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 486 days.

(21) Appl. No.: 18/139,135

(22) Filed: Apr. 25, 2023

(65) Prior Publication Data

US 2024/0364285 A1 Oct. 31, 2024

(51) Int. Cl.

*H03F 3/45* (2006.01)
*G01R 19/00* (2006.01)
*G05F 1/46* (2006.01)
*H03F 1/26* (2006.01)

(52) U.S. Cl.

CPC ..... *H03F 3/45076* (2013.01); *G01R 19/0053* (2013.01); *G05F 1/46* (2013.01); *H03F 1/26* (2013.01); *H03F 2200/372* (2013.01); *H03F 2203/45288* (2013.01)

(58) Field of Classification Search

CPC .. H03F 3/45076; H03F 1/26; H03F 2200/372; H03F 2203/45288; G01R 19/0053; G05F 1/46

USPC .......................................... 330/252–261, 297

See application file for complete search history.

(56) References Cited

U.S. PATENT DOCUMENTS

| | | | | |
|---|---|---|---|---|
| 7,480,487 | B2 | 1/2009 | Smart et al. | |
| 7,898,299 | B2 * | 3/2011 | Mattos | H03F 3/45475 324/123 C |
| 8,384,421 | B1 * | 2/2013 | Ravezzi | H03K 19/00361 326/26 |
| 9,210,748 | B2 | 12/2015 | Evans et al. | |
| 10,852,329 | B2 | 12/2020 | Fernandez et al. | |
| 2019/0107559 | A1 | 4/2019 | Lee et al. | |

* cited by examiner

*Primary Examiner* — Hieu P Nguyen
(74) *Attorney, Agent, or Firm* — Sterne, Kessler, Goldstein & Fox P.L.L.C.

(57) ABSTRACT

The present disclosure describes an apparatus, system, and method for cancelling noise (e.g., power supply noise). For example, the apparatus can include a load circuit, a sense resistor, and a current compensation circuit. The load circuit is configured to draw a first current (e.g., a load current). The sense resistor is configured to provide a voltage based on the first current. The current compensation circuit is configured to generate a second current (e.g., a compensation current) based on the voltage. A sum of the first current and the second current can be substantially constant.

20 Claims, 11 Drawing Sheets

NOISE CANCELLATION CIRCUIT

FIELD

This disclosure relates to a noise cancellation circuit and, more particularly, to a noise cancellation circuit in a power supply system.

BACKGROUND

A power supply system can provide a supply voltage to a circuit block in an electronic system, in which the performance and operation of the circuit block can depend on the integrity of the supply voltage. In a shared power supply system, where multiple circuit blocks share the same supply voltage, the operation of one circuit block can affect the supply voltage delivered to another circuit block, causing the other circuit block to have degraded performance and potentially be non-operational. For example, a first circuit block can share the same supply voltage as a second circuit block that has a voltage supply current dependent on an input with varying frequency and amplitude. These input variations from the second circuit block can cause an undesirable noise in the shared supply voltage, thus adversely affecting the supply voltage to—and operation of—the first circuit block.

SUMMARY

Embodiments of the present disclosure include an apparatus for cancelling noise (e.g., power supply noise) in an electronic system. The apparatus includes a load circuit, a sense resistor, and a current compensation circuit. The load circuit is configured to draw a first current (e.g., a load current). The sense resistor is configured to provide a voltage to the current compensation circuit based on the first current. The current compensation circuit is configured to generate a second current (e.g., a compensation current) based on the voltage, where the second current is drawn away from the load circuit. In some embodiments, a sum of the first current and the second current is substantially constant.

Embodiments of the present disclosure include a system for cancelling noise (e.g., power supply noise). The system includes a power distribution network, a circuit, and a noise cancellation circuit. The power distribution network is configured to provide a supply voltage to the circuit. The circuit is electrically connected to the power distribution network and configured to receive the supply voltage. The noise cancellation circuit is between the power distribution network and the circuit. The noise cancellation circuit is configured to generate a compensation current drawn away from the power distribution network. The compensation current is based on the load current.

Embodiments of the present disclosure include a method for cancelling noise in an electronic system. The method includes drawing, with a load circuit, a load current from a power distribution network. The method also includes providing a voltage based on the load current and generating a compensation current based on the voltage. The method further includes setting a current level of the power distribution network substantially equal to a summation of the load current and the compensation current. The method can further include a calibration method to set the current level of the power distribution network to improve power efficiency.

BRIEF DESCRIPTION OF THE DRAWINGS

Aspects of the present disclosure are best understood from the following detailed description when read with the accompanying figures. It is noted that, according to the standard practice in the industry, various features are not drawn to scale. In fact, the dimensions of the various features may be arbitrarily increased or reduced for clarity of discussion.

Illustrative embodiments will now be described with reference to the accompanying drawings. In the drawings, like reference numerals generally indicate identical, functionally similar, and/or structurally similar elements.

DETAILED DESCRIPTION

Figure 1:
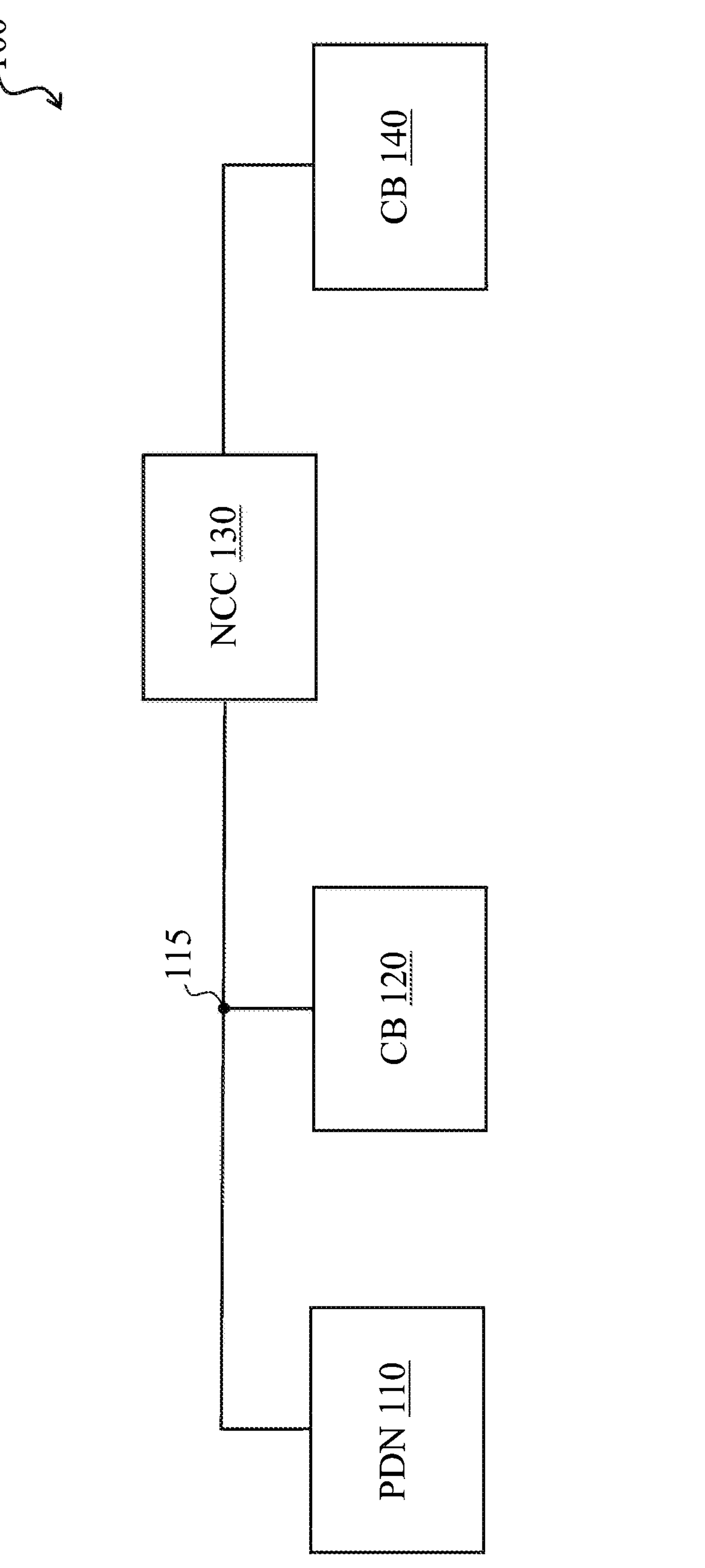
FIG. 1 is an illustration of a block-level representation of an electronic system with a noise cancellation circuit, according to some embodiments.

The following disclosure provides many different embodiments, or examples, for implementing different features of the provided subject matter. Specific examples of components and arrangements are described below to simplify the present disclosure. These are merely examples and are not intended to be limiting. In addition, the present disclosure repeats reference numerals and/or letters in the various examples. This repetition is for the purpose of simplicity and clarity and, unless indicated otherwise, does not in itself dictate a relationship between the various embodiments and/or configurations discussed.

It is noted that references in the specification to “one embodiment,” “an embodiment,” “an example embodiment,” and “exemplary” indicate that the embodiment described may include a particular feature, structure, or characteristic, but every embodiment may not necessarily include the particular feature, structure, or characteristic.

Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

In some embodiments, the terms "about" and "substantially" can indicate a value of a given quantity that varies within 20% of the value (e.g., +1%, +2%, +3%, +4%, +5%, +10%, +20% of the value). These values are merely examples and are not intended to be limiting. The terms "about" and "substantially" can refer to a percentage of the values as interpreted by those skilled in relevant art(s) in light of the teachings herein.

It is to be understood that the phraseology or terminology herein is for the purpose of description and not of limitation, such that the terminology or phraseology of the present specification is to be interpreted by those skilled in relevant art(s) in light of the teachings herein.

The following disclosure describes aspects of a noise cancellation circuit, such as a noise cancellation circuit to suppress power supply noise. The noise cancellation circuit can include a sense resistor and a current compensation circuit. The sense resistor is configured to provide a voltage to the current compensation circuit based on a first current (e.g., a load current) drawn by a load circuit. The current compensation circuit is configured to generate a second current (e.g., a compensation current) based on the voltage, where the second current is drawn away from the load circuit. A current level of a power distribution network—e.g., which provides a shared supply voltage to a circuit block and the load circuit—can be set substantially equal to a summation of the first and second currents. As a result, suppression of power supply noise caused by the load circuit can be achieved so that the shared supply voltage provided to the circuit block is noise free.

FIG. 1 is an illustration of a block-level representation of an electronic system 100, according to some embodiments. Electronic system 100 includes a power distribution network 110, a circuit block 120, a noise cancellation circuit 130, and a circuit block 140. Power distribution network 110 provides a supply voltage 115—e.g., a shared power supply voltage—to circuit block 120 and circuit block 140. Supply voltage 115 can be at any suitable voltage level for circuit block 120 and circuit block 140 (e.g., 1.0 V, 1.2 V, 1.8 V, 2.4 V, 3.3 V, and 5.0 V). Though electronic system 100 shows power distribution network 110 providing supply voltage 115 to two circuit blocks—e.g., circuit block 120 and circuit block 140—electronic system 100 is not limited to this circuit architecture. For example, power distribution network 110 can provide supply voltage 115 to a single circuit block (e.g., circuit block 140) or to other circuit blocks. These other circuit architectures are within the scope of the present disclosure.

Each of circuit block 120 and circuit block 140 can include any suitable type of electronic device, such as a processor circuit, a memory circuit, an input/output (I/O) circuit, a peripheral circuit, a communications circuit (e.g., a radio frequency circuit), and combinations thereof. In some embodiments, the processor circuit can include a general-purpose processor to perform computational operations, such as a central processing unit. The processor circuit can also include other types of processing units, such as a graphics processing unit, an application-specific circuit, and a field-programmable gate array circuit. In some embodiments, the memory circuit can include any suitable type of memory, such as Dynamic Random Access Memory, Static Random Access Memory, Read-Only Memory, Electrically Programmable Read-Only Memory, non-volatile memory, and combinations thereof.

In some embodiments, the I/O circuit can coordinate data transfer between one of circuit blocks 120 and 140 (e.g., a processor circuit) and a peripheral circuit. The I/O circuit can implement a version of Universal Serial Bus protocol or IEEE 1394 (Firewire®) protocol, according to some embodiments. Further, in some embodiments, the I/O circuit can perform data processing to implement networking standards, such as an Ethernet (IEEE 802.3) networking standard. Examples of the peripheral circuit can include storage devices (e.g., magnetic or optical media-based storage devices, including hard drives, tape drives, CD drives, DVD drives, and any suitable storage device), audio processing systems, and any suitable type of peripheral circuit, according to some embodiments.

In some embodiments, the communications circuit can include one or more radio frequency (RF) circuits that can control the receipt and transmission of data signals in the RF spectrum. The one or more RF circuits can include a receiver circuit to receive and process data signals. The one or more RF circuits can also include a transmitter circuit to process and amplify signals sent from electronic system 100. The receiver and transmitter circuits can include an antenna, an amplifier circuit, an oscillator circuit, other suitable communications circuits, and combinations thereof.

The embodiments described herein are directed to suppressing noise e.g., a power supply noise—in electronic system 100. For example, during operation, circuit block 140 may cause noise in supply voltage 115 which in turn, can cause undesirable noise in supply voltage 115 provided to circuit block 120. In some embodiments, noise cancellation circuit 130 is configured to generate a compensation current that is drawn away circuit block 140 to suppress the noise in supply voltage 115 delivered to circuit block 120, thus preventing circuit block 120 from having degraded performance and potential non-operation due to noise caused by circuit block 140.

Figure 2:
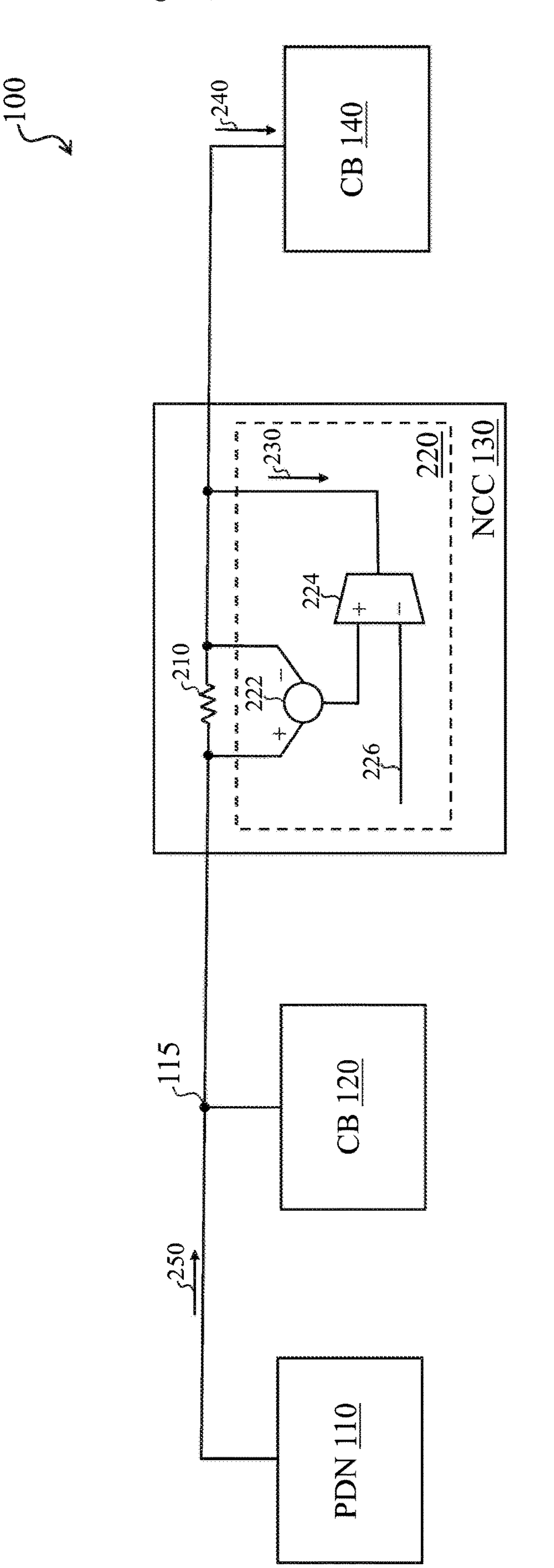
FIG. 2 is an illustration of a circuit-level representation of a noise cancellation circuit in an electronic system, according to some embodiments.

FIG. 2 is an illustration of a circuit-level representation of noise cancellation circuit 130, according to some embodiments. Noise cancellation circuit 130 includes a sense resistor 210 and a current compensation circuit 220. In some embodiments, sense resistor 210 is configured to provide a voltage to current compensation circuit 220 based on a load current 240 drawn by circuit block 140. Sense resistor 210 can be any suitable resistive element with any suitable resistance value. Load current 240 can include an operational current consumed by circuit block 140 and a noisy current due to the operation of circuit block 140. For example, the noisy current can be due to an input to circuit block 140 that varies with frequency and amplitude (e.g., a chirp input) and thus causes variations in load current 240.

Current compensation circuit 220 includes a voltage detector 222 and a transconductance circuit 224, according to some embodiments. Voltage detector 222 is configured to measure the voltage across sense resistor 210 due to the noisy current component in load current 240. Transconductance circuit 224 is configured to receive the measured voltage from voltage detector 222 as a first input and a reference voltage 226 as a second input. In some embodiments, transconductance circuit 224 is configured to generate an output current 230 (also referred to herein as "a compensation current 230") based on a voltage differential between the first and second inputs. The suppression of noise in current compensation circuit 220 can be proportional to the product of the transconductance ($G_m$) of transconductance circuit 224 and the resistance value of sense resistor 210 ($R_{210}$)—e.g., Noise Suppression $\alpha$ $[G_m \cdot R_{210}]$—according to some embodiments.

Figure 3:
FIG. 3 is an illustration of another circuit-level representation of a noise cancellation circuit, according to some embodiments.
Figure 3:
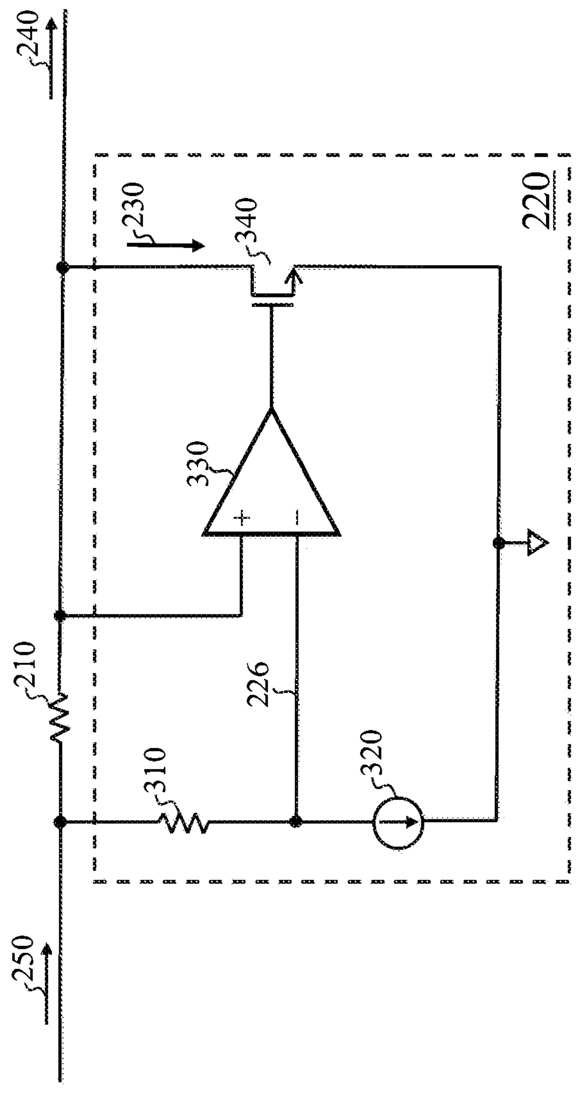

FIG. 3 is an illustration of another circuit-level representation of noise cancellation circuit 130, according to some embodiments. In some embodiments, current compensation circuit 220 includes a reference resistor 310, a current source 320, an amplifier circuit 330, and a transistor 340. In some embodiments, reference resistor 310 and current source 320 (also collectively referred to herein as a "voltage reference generator") generate reference voltage 226, which is received by amplifier circuit 330 as a first input. Reference resistor 310 can be electrically connected to a first terminal of sense resistor 210—e.g., at a circuit node shared with power distribution network 110 and circuit block 120—according to some embodiments. Reference resistor 310 can be any suitable resistive element with any suitable resistance value to generate (along with current source 320) reference voltage 226. Also, current source 320 can be any suitable current source circuit that generates any suitable current. In some embodiments, current source 320 can be an adjustable current source to provide multiple current values, thus providing multiple voltage values for reference voltage 226.

Amplifier circuit 330 is configured to receive reference voltage 226 as a first input and a voltage at a second terminal of sense resistor 210—e.g., at a circuit node shared with circuit block 140—as a second input. Based on a voltage differential between the first and second inputs, amplifier circuit 330 is configured to provide an output voltage to a gate terminal of transistor 340. In turn, transistor 340 provides compensation current 230 based on the voltage level at its gate terminal. Transistor 340 can be any type of suitable transistor, such as n-type metal-oxide-semiconductor field effect transistor.

In some embodiments, the resistance value of reference resistor 310 and the configuration of current source 320 can be selected to generate a minimum applied voltage at the output of amplifier circuit 330 (and thus at the gate terminal of transistor 340). The minimum applied voltage can cause transistor 340 to generate a minimum current (also referred to herein as "a bleed current") for noise cancellation circuit 130. In turn, the bleed current can be maintained through transistor 340 for sufficient loop gain under all conditions for electronic system 100, according to some embodiments. Thus, in some embodiments, a summation of the bleed current and the additional current generated by transistor 340 based on the voltage differential of amplifier circuit 330 forms compensation current 230.

As described above with respect to FIG. 2, the suppression of noise in current compensation circuit 220 can be proportional to the product of the transconductance ($G_m$) of transconductance circuit 224 and the resistance value of sense resistor 210 ($R_{210}$)—e.g., Noise Suppression $\alpha$ $[G_m \cdot R_{210}]$ according to some embodiments. With respect to FIG. 3, the transconductance ($G_m$) can be implemented by a gain of amplifier circuit 330 ($A_{330}$) and a transconductance of transistor 340 ($G_{m340}$), according to some embodiments. Therefore, the suppression of noise in noise cancellation circuit 130—based on the circuit arrangement in FIG. 3—can be proportional to the product of the gain of amplifier circuit 330 ($A_{330}$), the transconductance of transistor 340 ($G_{m340}$), and the resistance value of sense resistor 210 ($R_{210}$)—e.g., Noise Suppression $\alpha$ $[A_{330} \cdot G_{m340} \cdot R_{210}]$ according to some embodiments.

Figures 4A, 4B, 4C:
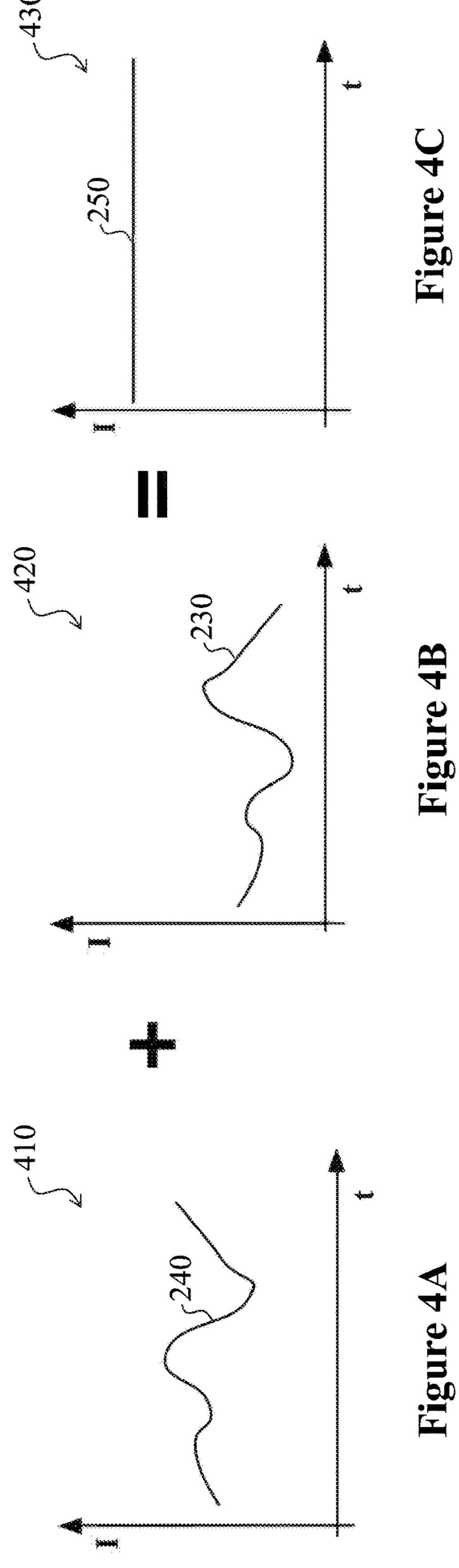
FIGS. 4A-4C are illustrations of exemplary current waveforms for an electronic system with a noise cancellation circuit, according to some embodiments.

FIGS. 4A-4C are illustrations of exemplary current waveforms for electronic system 100, according to some embodiments. The exemplary current waveforms are described with respect to electronic system 100 in FIGS. 1-3 above. FIG. 4A represents an exemplary waveform 410 of load current 240 from circuit block 140 as a function of time. FIG. 4B represents an exemplary waveform 420 of current compensation current 230 from noise cancellation circuit 130 as a function of time. FIG. 4C represents an exemplary waveform 430 of an output current 250 from power distribution network 110 as a function of time. The curvatures in waveforms 410, 420, and 430 are exemplary and for illustration purposes; these waveforms can include different curvatures.

Referring to FIG. 4A, load current 240 includes an operational current consumed by circuit block 140 and a noisy current due to the operation of circuit block 140. As discussed above, the noisy current can be due to an input to circuit block 240 that varies with frequency and amplitude (e.g., a chirp input) and thus causes variations in load current 240. An exemplary depiction of variations in load current 240—due to the noisy current—over time is shown in waveform 410.

Referring to FIG. 4B, compensation current 230 is generated based on the noisy current component in load current 240 flowing through sense resistor 210, according to some embodiments. As described above, current compensation circuit 220 is configured to compare a voltage across sense resistor 210 due to the noisy current component in load current 240 to reference voltage 226. Based on a voltage differential between these two voltages, current compensation circuit 220 is configured to generate compensation current 230. An exemplary depiction of variations in compensation current 230—due to the noisy component in load current 240—over time is shown in waveform 420.

Referring to FIG. 4C, output current 250 from power distribution network 110 is set to a substantially constant current level that is substantially equal to the summation of load current 240 and compensation current 230 over time, according to some embodiments. By setting output current 250 to this substantially constant current level, the total current drawn from power distribution network 110 is a substantially constant current and devoid of fluctuations due to noise, thus protecting circuit block 120 from power supply noise caused by circuit block 140.

Figure 5:
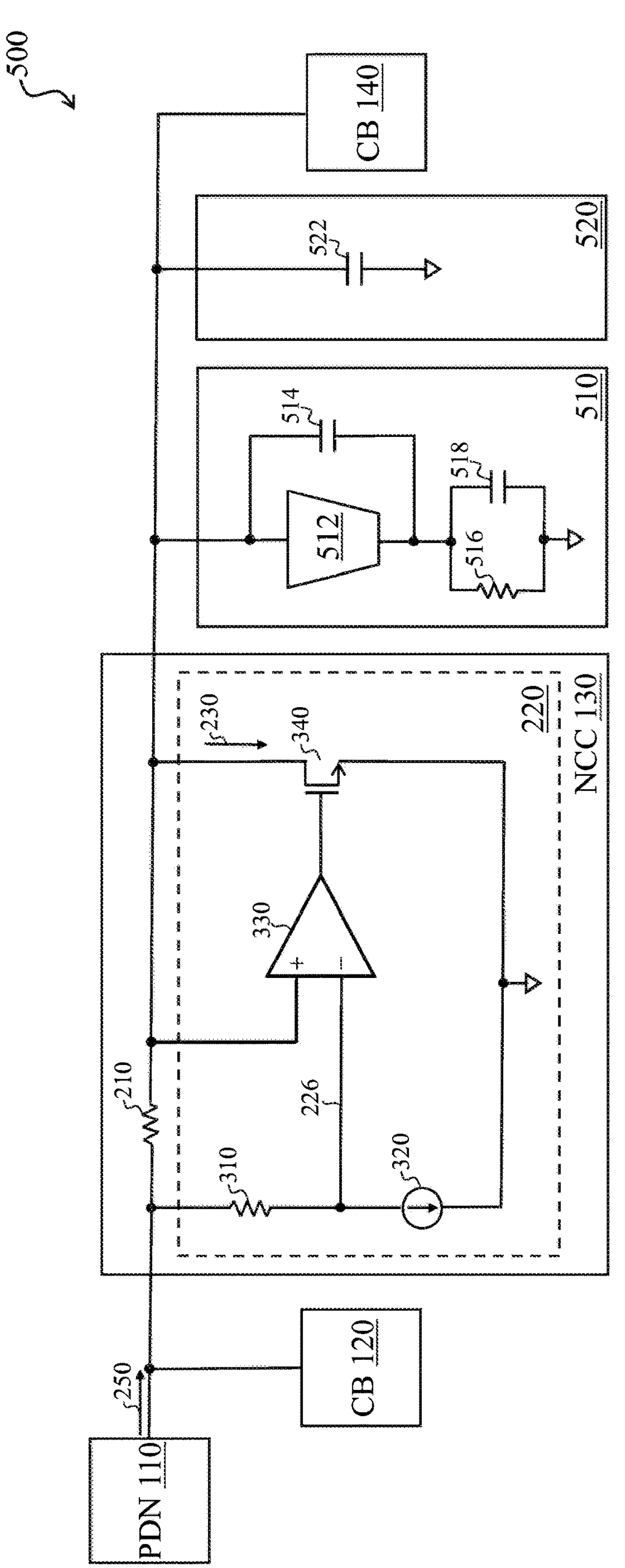
FIG. 5 is an illustration of an electronic system with a noise cancellation circuit and noise suppression filter circuits, according to some embodiments.

FIG. 5 is an illustration of an electronic system 500 with noise cancellation circuit 130 and noise suppression filter circuits, according to some embodiments. Electronic system 500 includes power distribution network 110, circuit block 120, noise cancellation circuit 130, circuit block 140, mid-frequency noise suppression filter circuit 510, and high-frequency noise suppression filter circuit 520. Power distribution network 110, circuit block 120, noise cancellation circuit 130, and circuit block 140 are described above with respect to FIGS. 1-3.

Figure 6:
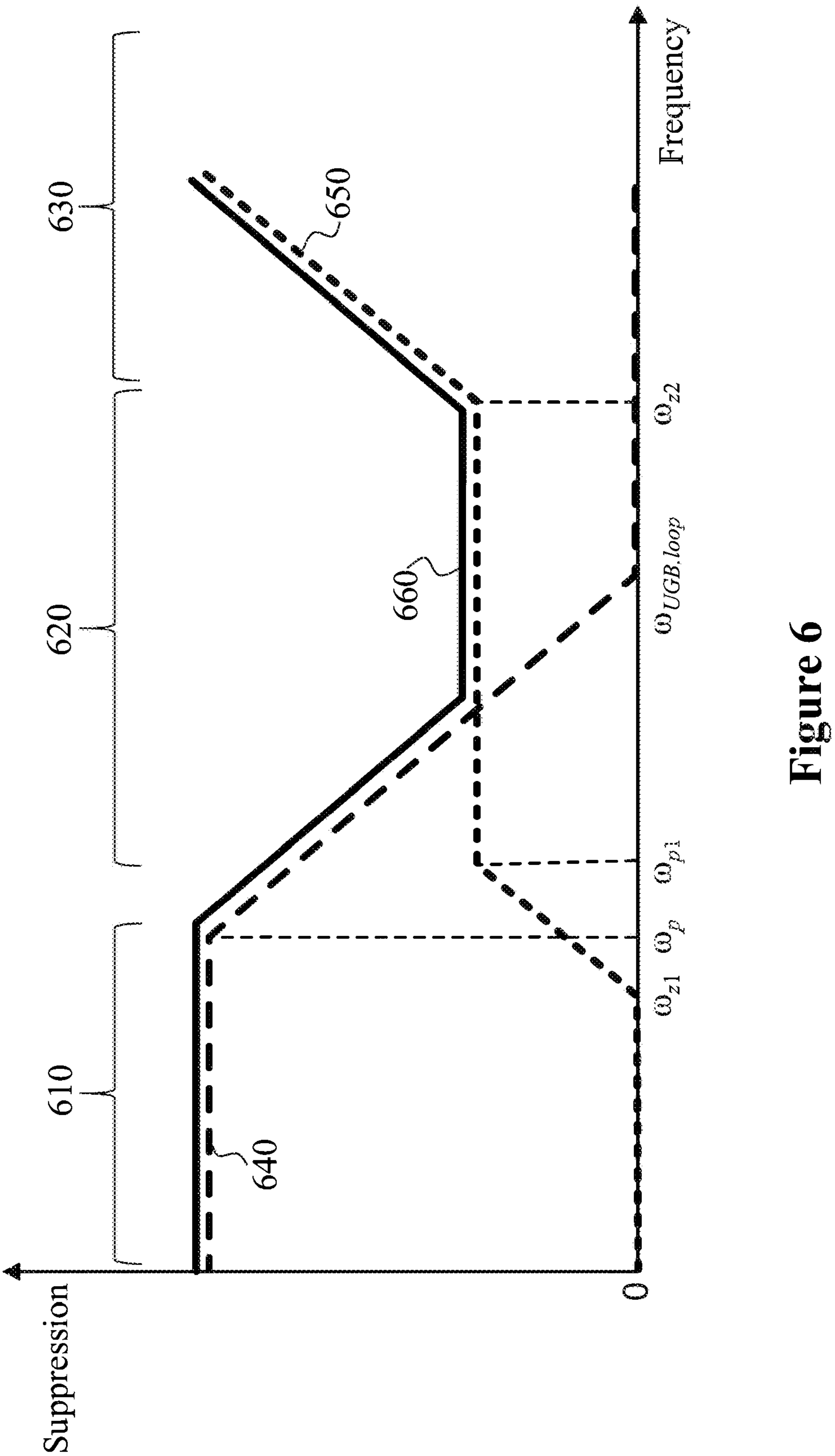
FIG. 6 is an illustration of exemplary noise cancellation frequency response waveforms for an electronic system with a noise cancellation circuit and noise suppression filter circuits, according to some embodiments.

The noise suppression characteristics of noise cancellation circuit 130, mid-frequency noise suppression filter circuit 510, and high-frequency noise suppression filter circuit 520 are described with respect to the waveforms shown in FIG. 6, which shows exemplary noise cancellation frequency response waveforms 640, 650, and 660. Exemplary noise cancellation frequency response waveform 640 shows a low-frequency response—over a low-frequency range 610—due to noise cancellation circuit 130. Exemplary noise cancellation frequency response waveform 650 shows a mid-frequency response and a high-frequency response—over a mid-frequency range 620 and a high-frequency range 630, respectively—due to mid-frequency noise suppression filter circuit 510 and high-frequency noise suppression filter circuit 520. Exemplary noise cancellation frequency response waveform 660 shows a combined frequency response due to noise cancellation circuit 130, mid-frequency noise suppression filter circuit 510, and high-frequency noise suppression filter circuit 520. The curvatures in noise cancellation frequency response waveforms 640, 650, and 660 are exemplary and for illustration purposes; these waveforms can include different curvatures.

Referring to FIG. 5, in some embodiments, noise cancellation circuit 130 is configured to function as a low-frequency noise suppression filter circuit (e.g., a low-pass filter circuit) with a gain and bandwidth defined by the following equation:

$$\text{Suppression} = A_{330} \cdot G_{m340} \cdot R_{210} \cdot \left[ \frac{1 + \frac{s}{w_p \cdot A_{330} \cdot G_{m340} \cdot R_{210}}}{1 + \frac{S}{w_p}} \right]$$

where $A_{330}$ is the gain of amplifier circuit 330, $G_{m340}$ is the transconductance of transistor 340, $R_{210}$ is the resistance value of sense resistor 210, and frequency $\omega_p$ defines the bandwidth of the low-frequency response of electronic system 500. Referring to FIG. 6, exemplary noise cancellation frequency response waveform 640 represents the suppression frequency response of noise cancellation circuit 130, where the gain is defined by $[A_{330} \cdot G_{m340} \cdot R_{210}]$ and the bandwidth is defined by frequency $\omega_p$ (e.g., approximate cut-off frequency of the low-frequency response), according to some embodiments. Based on a desired low-frequency response for electronic system 500, the gain of amplifier circuit 330, the transconductance of transistor 340, and the resistance value of sense resistor 210 of noise cancellation circuit 130 can be designed accordingly.

Referring to FIGS. 5 and 6, in some embodiments, mid-frequency noise suppression filter circuit 510 and high-frequency noise suppression filter circuit 520 can further shape the frequency response of electronic circuit 500 in mid-frequency range 620 and high-frequency range 630. Mid-frequency noise suppression circuit 510 includes a transconductance circuit 512 and a capacitor 514 electrically connected to transconductance circuit 512 in a parallel arrangement, according to some embodiments. In some embodiments, parasitic components of transconductance circuit 512 can be represented by a parasitic resistor 516 and a parasitic capacitor 518 electrically connected to parasitic resistor 516 in a parallel arrangement. Transconductance circuit 512 can have a similar function and circuit design as transconductance circuit 224 (described above)—or any other suitable function and circuit design—according to some embodiments.

Referring to FIG. 6, exemplary noise cancellation frequency response waveform 650 represents the suppression frequency response of mid-frequency noise suppression filter circuit 510 and high-frequency noise suppression filter circuit 520, according to some embodiments. From 0 Hz to about a frequency $w_{z1}$, mid-frequency noise suppression circuit 510 does not suppress noise, where frequency $w_{z1}$ can be defined by the following equation:

$$w_{z1} = -\frac{1}{R_{516} \cdot C_{518} \cdot (1 + G_{m512} \cdot R_{210})}$$

and where $R_{516}$ is the resistance value of parasitic resistor 516, $C_{518}$ is the capacitance value of parasitic capacitor 518, $G_{m512}$ is the transconductance of transconductance circuit 512, and $R_{210}$ is the resistance value of sense resistor 210. A frequency $w_{p1}$ at which mid-frequency noise suppression circuit 510 begins to suppress noise can be defined by the following equation:

$$w_{p1} = -\frac{1}{R_{516} \cdot (C_{518} \cdot C_{514})}$$

where $R_{516}$ and $C_{518}$ are defined above and $C_{514}$ is the capacitance value of capacitor 514. In some embodiments, mid-frequency noise suppression filter circuit 510 can have a noise suppression level less than that of noise cancellation circuit 130 between frequency $w_{p1}$ and frequency $w_{z2}$. Frequency $w_{z2}$ can be defined by the following equation:

$$w_{z2} = -\frac{1 + G_{m512} \cdot R_{210}}{R_{210} \cdot C_{514}}$$

where $G_{m512}$ and $R_{210}$ are defined above and $C_{514}$ is the capacitance value of capacitor 514. At frequency $w_{z2}$ and higher frequencies, the noise suppression level can increase. Based on a desired mid-frequency response for electronic system 500, the resistance values of sense resistor 210 and parasitic resistor 516, the capacitance values of parasitic capacitor 514 and capacitor 518, and the transconductance of transconductance circuit 512 can be designed accordingly.

Further, referring to FIG. 5, high-frequency noise suppression filter circuit 520 includes a capacitor 522, according to some embodiments. Capacitor 522 can be a decoupling capacitor to suppress noise at higher frequencies (e.g., frequencies higher than frequency $w_{z2}$). In some embodiments, at the higher frequencies, high-frequency noise suppression filter circuit 520 can have a noise suppression level substantially equal to or higher than that of noise cancellation circuit 130. Based on a desired high-frequency response for electronic system 500, the capacitance value of capacitor 522 can be designed accordingly.

Referring to FIGS. 5 and 6, the combination of the low-, mid-, and high-frequency responses generated by noise cancellation circuit 130, mid-frequency noise suppression filter circuit 510, and high-frequency noise suppression filter circuit 520 results in exemplary noise cancellation frequency response waveform 660. As shown in FIG. 6, exemplary noise cancellation frequency response waveform 660 has a higher noise suppression level in low-frequency range 610 and high-frequency range 630 than that in mid-frequency range 620. The noise suppression levels in low-frequency range 610, mid-frequency range 620, and high-frequency range 630 can vary and can depend on a desired overall frequency response for electronic system 500. These other frequency responses for electronic system 500 are within the scope of the present disclosure.

Figure 7:
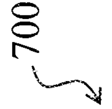
FIG. 7 is an illustration of a method for cancelling power supply noise in an electronic system, according to some embodiments.
Figure 7:
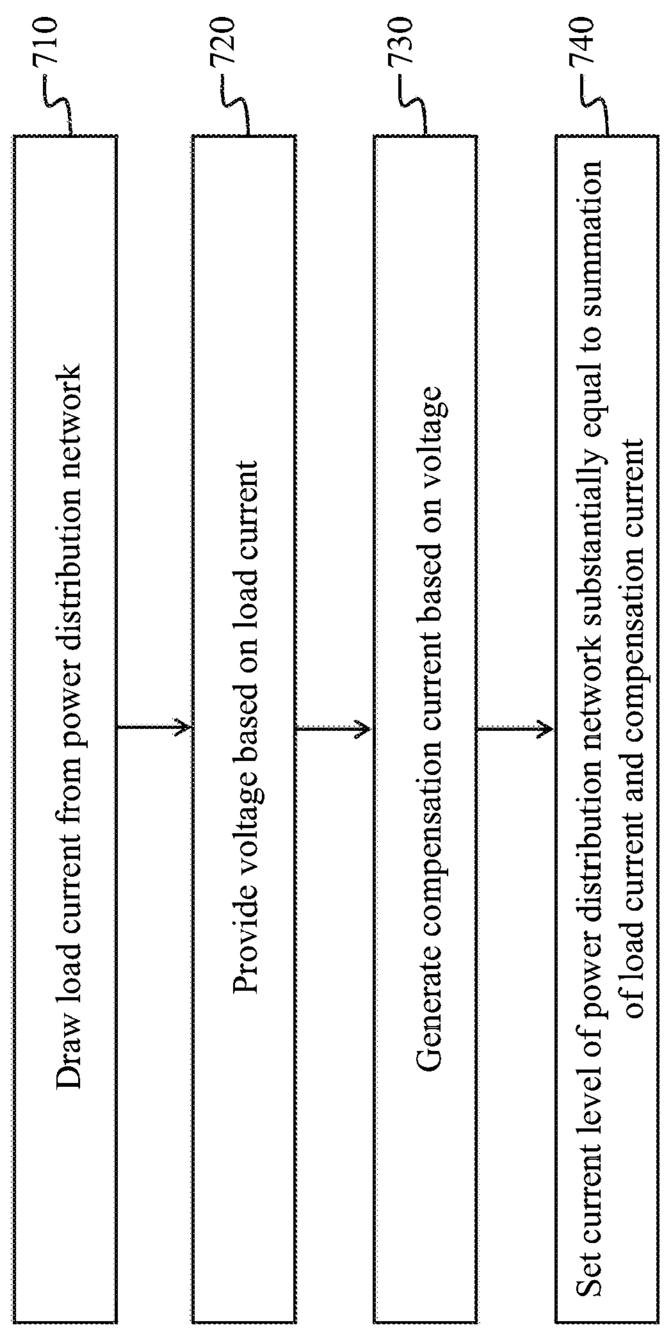

FIG. 7 is an illustration of a method 700 for cancelling power supply noise in an electronic system, according to some embodiments. For illustrative purposes, the operations illustrated in method 700 will be described with reference to the electronic system and associated circuits described above with respect to FIGS. 1-6. Other representations of the electronic system and associated circuits are within the scope of the present disclosure. Also, additional operations may be performed between various operations of method 700 and may be omitted merely for clarity and ease of description. The additional operations can be provided before, during, and/or after method 700, in which one or more of these additional operations are briefly described herein. Moreover, not all operations may be needed to perform the disclosure provided herein. Additionally, some of the operations may be performed simultaneously or in a different order than shown in FIG. 7. In some embodiments, one or more other operations may be performed in addition to or in place of the presently-described operations.

Referring to FIG. 7, at operation 710, a load circuit draws a load current from a power distribution network. Referring to FIG. 2, circuit block 140 can draw load current 240 from power distribution network 110. Load current 240 can include an operational current consumed by circuit block 140 and a noisy current due to the operation of circuit block 140. For example, the noisy current can be due to an input to circuit block 140 that varies with frequency and amplitude (e.g., a chirp input) and thus causes variations in load current 240.

Referring to FIG. 7, at operation 720, a voltage is provided based on the load current. Referring to FIGS. 2 and 3, sense resistor 210 is configured to provide a voltage based on load current 240. For example, load current 240 from circuit block 140 can flow through sense resistor 210 to generate the voltage.

Referring to FIG. 7, at operation 730, a compensation current is generated based on the voltage. Referring to FIGS. 2 and 3, current compensation circuit 220 is configured to measure the voltage across sense resistor 210 due to load current 240. Based on the voltage, current compensation circuit 220 generates compensation current 230. For example, referring to FIG. 3, amplifier circuit 330 is configured to receive reference voltage 226 as a first input and a voltage at a second terminal of sense resistor 210—e.g., at a circuit node shared with circuit block 140—as a second input. Based on a voltage differential between the first and second inputs, amplifier circuit 330 is configured to provide an output voltage to the gate terminal of transistor 340. In turn, transistor 340 provides compensation current 230 based on the voltage level at its gate terminal.

Referring to FIG. 7, at operation 740, a current level of the power distribution network is set substantially equal to a summation of the load current and the compensation current. Referring to FIGS. 2-4, output current 250 from power distribution network 110 is set to a substantially constant current level that is substantially equal to the summation of load current 240 and compensation current 230 over time, according to some embodiments. By setting output current 250 to this substantially constant current level, the total current drawn from power distribution network 110 is a substantially constant current and devoid of fluctuations due to noise, thus protecting circuit block 120 from power supply noise caused by circuit block 140.

Further, in some embodiments, the frequency response of the electronic system can be set based on the design noise cancellation circuit and other filter circuits. For example, referring to FIGS. 5 and 6, the combination of the low-, mid-, and high-frequency responses generated by noise cancellation circuit 130, mid-frequency noise suppression filter circuit 510, and high-frequency noise suppression filter circuit 520 results in exemplary noise cancellation frequency response waveform 660. Here, noise cancellation circuit 130 suppresses noise at a first noise suppression level in low-frequency range 610. Mid-frequency noise suppression filter circuit 510 suppresses noise at a second suppression level in mid-frequency range 620. High-frequency noise suppression filter circuit 520 suppresses noise at a third noise suppression level in high-frequency range 630. In some embodiments, as shown in FIG. 6, the first and third noise suppression levels are higher than the second noise suppression level. The noise suppression levels in low-frequency range 610, mid-frequency range 620, and high-frequency range 630 can vary and can depend on a desired overall frequency response for electronic system 500.

Referring to FIGS. 1-6, across process variations, various supply voltage conditions, and temperature variations, the power efficiency of the electronic system can vary, according to some embodiments. For example, output current 250 provided by power distribution network 110 can vary significantly (e.g., by over about 50%) over process variations, various supply voltage conditions, and temperature variations, thus significantly varying the power consumed by the electronic system. To reduce power consumption and thus improve power efficiency of the electronic system, output current 250 can be calibrated.

Referring to FIG. 3, output current 250 can be calibrated by setting current source 320 so that the bleed current is a minimum value, regardless of process variations, various supply voltage conditions, and temperature variations in the electronic system, according to some embodiments. As discussed above with respect to FIGS. 3 and 4, output current 250 can be set to a substantially constant current level that is substantially equal to the summation of load current 240 and compensation current 230 over time. Further, as discussed above, compensation current 230 can be a summation of the bleed current and the additional current generated by transistor 340 based on the voltage differential of amplifier circuit 330. By setting the bleed current to a substantially constant value, the impact of the bleed current's contribution to output current 250 can be reduced over process variations, various supply voltage conditions, and temperature variations in the electronic system. In turn, power consumption can be reduced and power efficiency can be improved in the electronic system.

Figure 8:
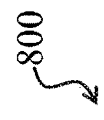
FIG. 8 is an illustration of a circuit-level representation of a noise cancellation circuit having an adjustable current source in an electronic system, according to some embodiments.
Figure 8:
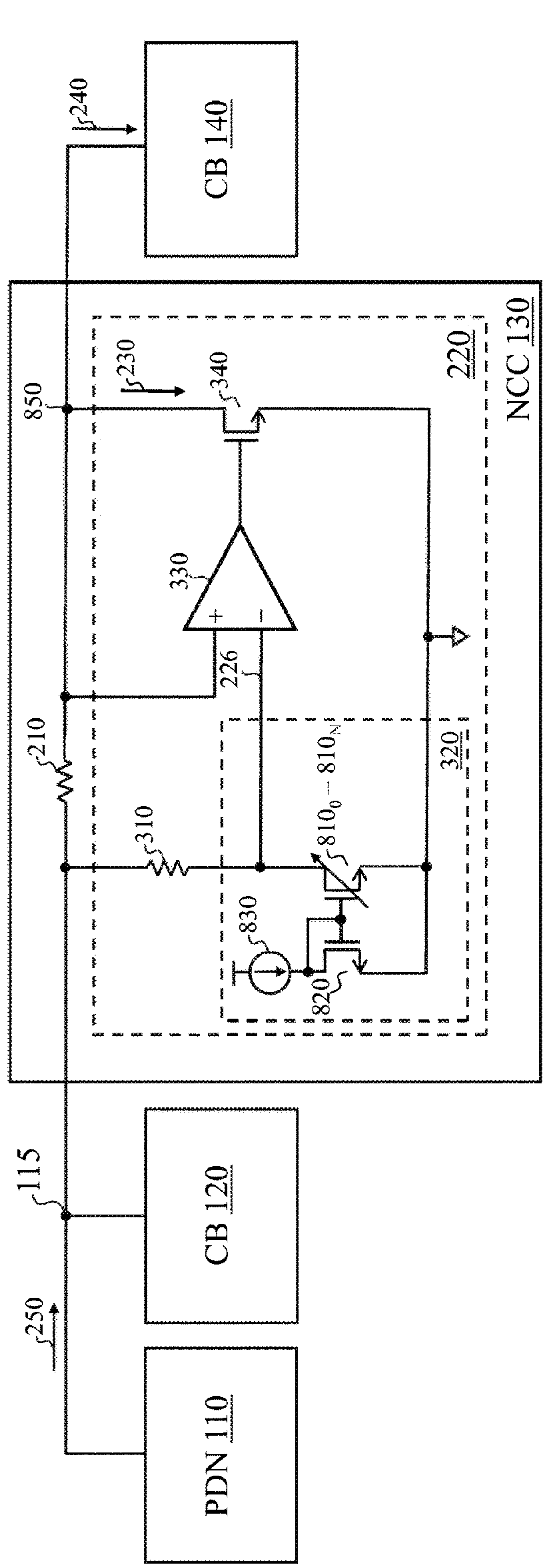

FIG. 8 is an illustration of an electronic system 800 with noise cancellation circuit 130 having an adjustable current source, according to some embodiments. Electronic system 800 includes power distribution network 110, circuit block 120, noise cancellation circuit 130, and circuit block 140. Power distribution network 110, circuit block 120, and circuit block 140 are described above with respect to FIGS. 1-7.

Noise cancellation circuit 130 includes sense resistor 210 and current compensation circuit 220. Current compensation circuit 220 includes reference resistor 310, current source 320, amplifier circuit 330, and transistor 340. In some embodiments, current source 320 can be an adjustable current source with transistors $\mathbf{810}_0$-$\mathbf{810}_N$, a transistor 820, and a current source 830 arranged in a current mirror configuration. In the current mirror configuration, a single transistor $\mathbf{810}_0$ up to multiple transistors $\mathbf{810}_N$ (where N is an integer greater than zero) can be selected based on a desired current for current source 320 to generate reference voltage 226. Transistors $\mathbf{810}_0$-$\mathbf{810}_N$ and 820 can be any type of suitable transistor, such as n-type metal-oxide-semiconductor field effect transistor. Also, current source 830 can be any suitable current source circuit that generates any suitable current.

Figure 9:
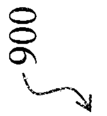
FIG. 9 is an illustration of a method for calibrating a bleed current for a noise cancellation circuit in an electronic system, according to some embodiments.
Figure 9:
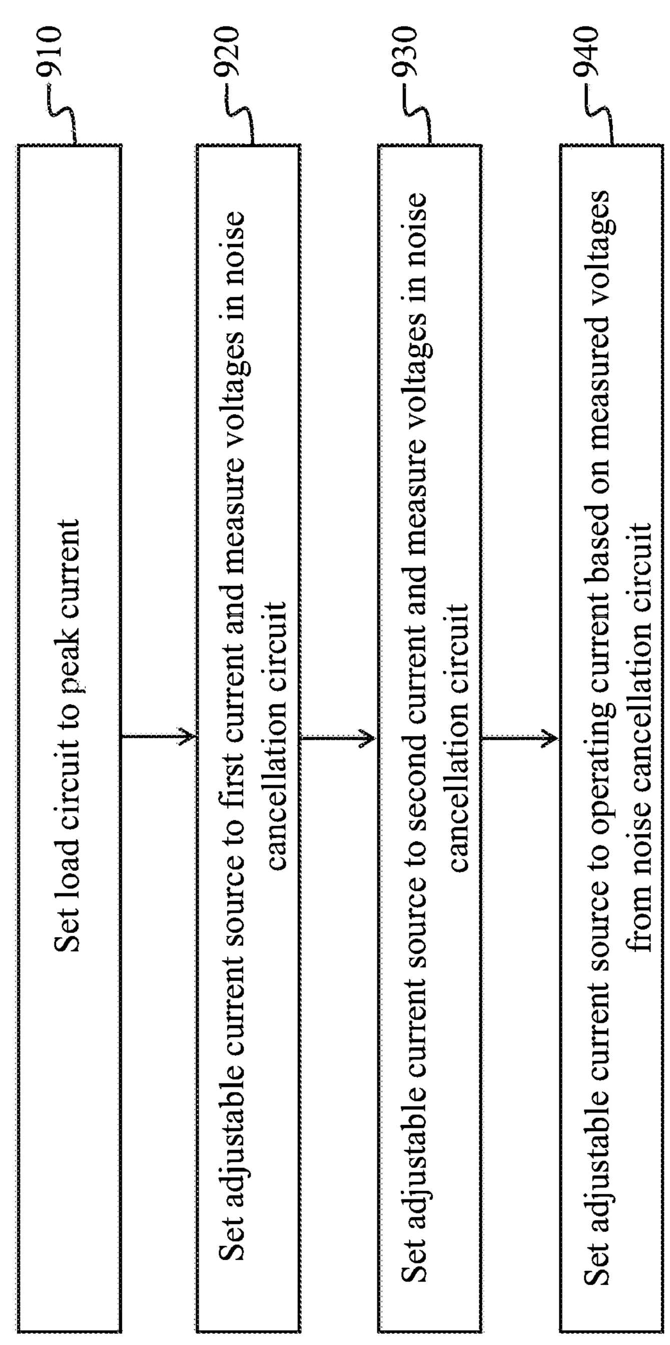

In some embodiments, the number of transistors $\mathbf{810}_0$-$\mathbf{810}_N$ to be selected to set the bleed current for noise cancellation circuit 130—also referred to herein as a "k" number of selected transistors 810 (where k is an integer between 1 and N)—can be determined using a calibration method. FIG. 9 is an illustration of a method 900 for calibrating the bleed current in noise cancellation circuit 130 in electronic system 800, according to some embodiments. In some embodiments, method 900 can be performed during a testing phase—e.g., using automatic test equipment—in the design of electronic system 800. For illustrative purposes, the operations illustrated in method 900 will be described with reference to the electronic system and associated circuits described above with respect to FIGS. 1-8 and exemplary voltage waveforms shown in FIG. 10. Other representations of the electronic system and associated circuits are within the scope of the present disclosure. Also, additional operations may be performed between various operations of method 900 and may be omitted merely for clarity and ease of description. The additional operations can be provided before, during, and/or after method 900, in which one or more of these additional operations are briefly described herein. Moreover, not all operations may be needed to perform the disclosure provided herein. Additionally, some of the operations may be performed simultaneously or in a different order than shown in FIG. 9. In some embodiments, one or more other operations may be performed in addition to or in place of the presently-described operations.

Figure 10:
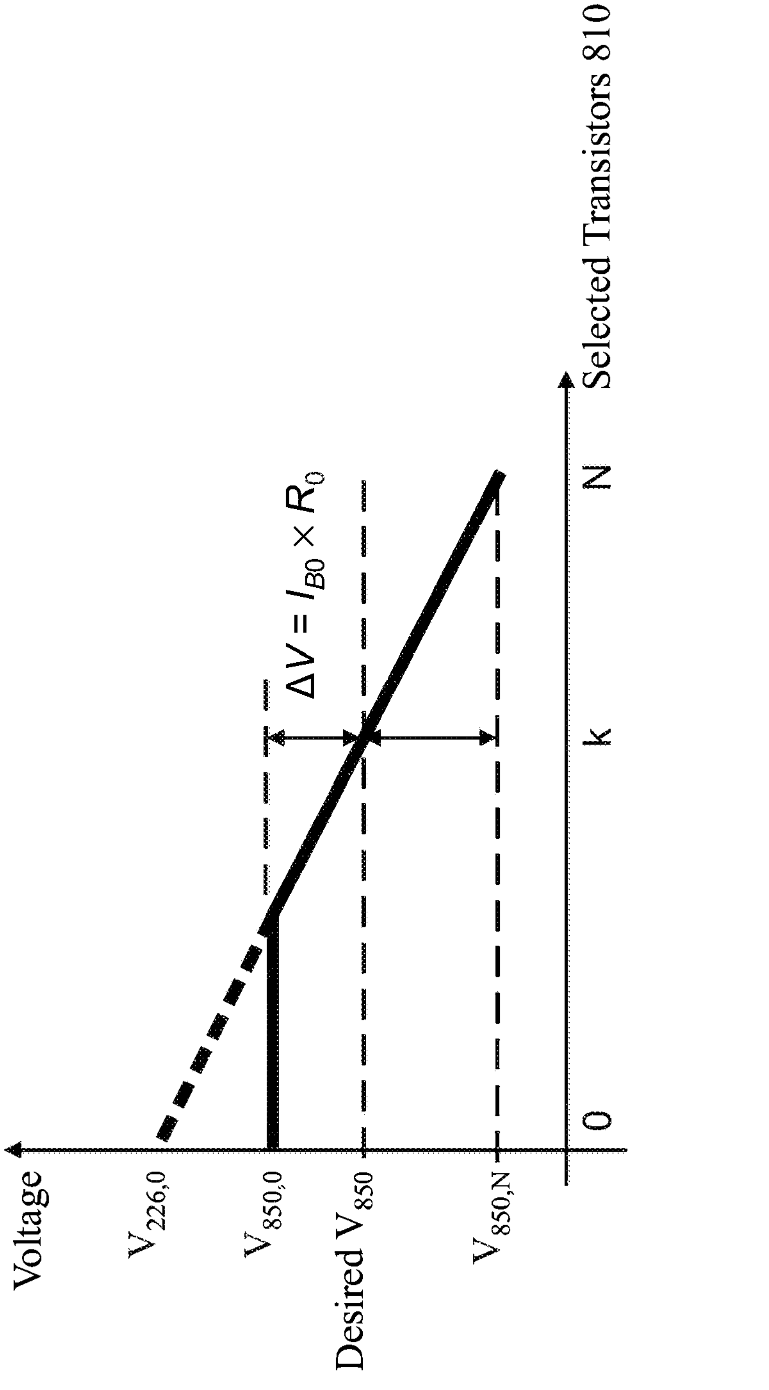
FIG. 10 is an illustration of an exemplary voltage waveforms as a function of a current mirror ratio, according to some embodiments.

FIG. 10 is an illustration of exemplary voltage waveforms as a function of a current mirror ratio of current source 320 in FIG. 8, according to some embodiments. For various number of selected transistors 810$_0$-810$_N$, the waveforms show exemplary voltages at various circuit nodes of noise cancellation circuit 130—e.g., at reference voltage 226 and at an output voltage 825. Based on these voltages, an optimal number of transistors 810$_0$-810$_N$ can be selected—e.g., a k number of selected transistors 810—to generate the bleed current for noise cancellation circuit 130. The waveforms in FIG. 10 will be used to facilitate in the explanation of method 900.

Referring to FIG. 9, at operation 910, a load circuit is set to a peak current. Referring to FIG. 8, circuit block 140 is an example of a load circuit that draws load current 240 from power distribution network 110. For operation 910, circuit block 140 can be configured to operate in a state that draws a peak (e.g., maximum) load current 240 from power distribution network 110.

Referring to FIG. 9, at operation 920, an adjustable current source in a noise cancellation circuit is set to a first current and one or more voltages in the noise cancellation circuit are measured. Referring to FIG. 8, current source 320 is set to a first current to generate reference voltage 226 (via reference resistor 310). In some embodiments, the first current can be based on a single transistor 810$_0$ being selected in current source 320. Based on the first current, reference voltage 226 ($V_{226,0}$) and output voltage 850 ($V_{850,0}$) can be measured in noise cancellation circuit 130, according to some embodiments. Referring to FIG. 10, the waveforms show exemplary voltages for reference voltage 226 ($V_{226,0}$) and output voltage 850 ($V_{850,0}$) when a single transistor 810$_0$ is selected in current source 320.

Referring to FIG. 9, at operation 930, the adjustable current source in the noise cancellation circuit is set to a second current and one or more voltages in the noise cancellation circuit are measured. Referring to FIG. 8, current source 320 is set to a second current to generate reference voltage 226 (via reference resistor 310). In some embodiments, the second current can be based on N number of transistors 810$_0$-810$_N$ selected in current source 320. Based on the second current, reference voltage 226 ($V_{226,N}$) and output voltage 850 ($V_{850,N}$) can be measured in noise cancellation circuit 130, according to some embodiments. Referring to FIG. 10, the waveforms show an exemplary voltage for output voltage 850 ($V_{850,N}$) when N number of transistors 810$_0$-810$_N$ are selected in current source 320.

Referring to FIG. 9, at operation 940, the adjustable current source is set to an operating current based on the one or more voltage measurements from the noise cancellation circuit. Referring to FIG. 8, current source 320 is set to an operating current—e.g., to generate the bleed current in noise cancellation circuit 130—based on the noise cancellation circuit voltage measurements at the first and second currents of current source 320. In some embodiments, the operating current is based on a k number of transistors 810 selected in current source 320, in which k can be determined by the following equation:

$$k = N \cdot \left[1 - \frac{(V_{850,0} - V_{850,N} - I_{B,0} \cdot R_O)}{(V_{226,0} - V_{226,N})}\right]$$

where N is the total number of selectable transistors 810, $V_{850,0}$ is output voltage 850 at the first current of current source 320, $V_{850,N}$ is output voltage 850 at the second current of current source 320, $I_{B,0}$ is the bleed current at the first current of current source 320, $R_0$ is an output resistance (as seen at the circuit node of output voltage 850), $V_{226,0}$ is reference voltage 226 at the first current of current source 320, and $V_{226,N}$ is reference voltage 226 at the second current of current source 320. If the value of k results in a non-integer, the value can be rounded up or down to determine the final value of k. Referring to FIG. 10, the value of k represents a desired output voltage 850 that is ΔV ($I_{B,0} \cdot R_0$) less than output voltage 850 at the first current of current source 320 ($V_{850,0}$), according to some embodiments.

After the value of k is determined, current source 320 can be set to this value to generate the bleed current for noise cancellation circuit 130. By setting the bleed current to this value, the impact of the bleed current's contribution to output current 250 can be reduced over process variations, various supply voltage conditions, and temperature variations in the electronic system. In turn, power consumption can be reduced and power efficiency can be improved in the electronic system.

In summary, the above embodiments are directed to a noise cancellation circuit, such as noise cancellation circuit 130. Noise cancellation circuit 130 can include sense resistor 210 and current compensation circuit 220. Sense resistor 210 is configured to provide a voltage to current compensation circuit 220 based on load current 240 drawn by circuit block 140 (e.g., a load circuit). Current compensation circuit 220 is configured to generate compensation current 230 based on the voltage, where compensation current 230 is drawn away from circuit block 140. A current level of power distribution network 110—e.g., which provides a shared supply voltage 115 to circuit block 120 and circuit block 140—can be set substantially equal to a summation of the load current and compensation current. As a result, suppression of power supply noise caused by circuit block 140 can be achieved so that the shared supply voltage provided to circuit block 120 is noise free.

Figure 11:
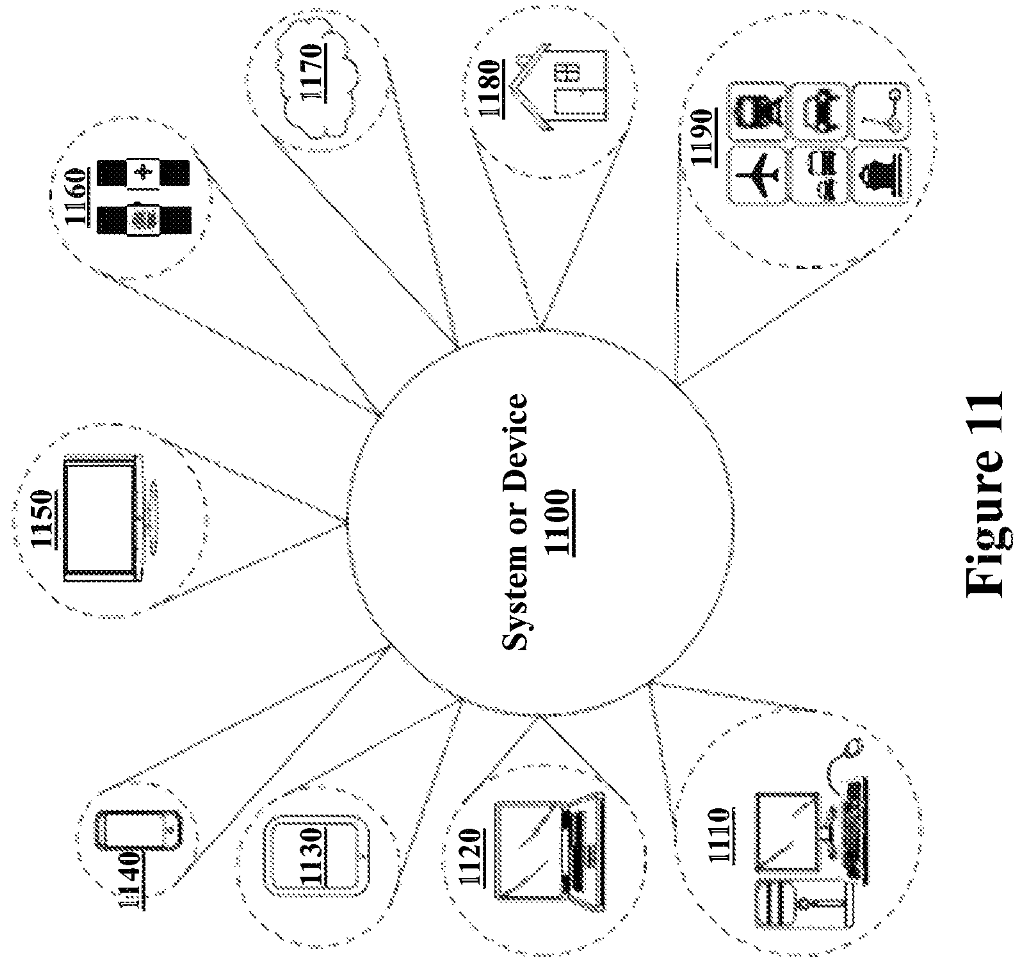
FIG. 11 is an illustration of various exemplary systems or devices that can include the disclosed embodiments.

FIG. 11 is an illustration of exemplary systems or devices that can include the disclosed embodiments. System or device 1100 can incorporate one or more of the disclosed embodiments in a wide range of areas. For example, system or device 1100 can be implemented in one or more of a desktop computer 1110, a laptop computer 1120, a tablet computer 1130, a cellular or mobile phone 1140, and a television 1150 (or a set-top box in communication with a television).

Also, system or device 1100 can be implemented in a wearable device 1160, such as a smartwatch or a health-monitoring device. In some embodiments, the smartwatch can have different functions, such as access to email, cellular service, and calendar functions. Wearable device 1160 can also perform health-monitoring functions, such as monitoring a user's vital signs and performing epidemiological functions (e.g., contact tracing and providing communication to an emergency medical service). Wearable device 1160 can be worn on a user's neck, implantable in user's body, glasses or a helmet designed to provide computer-generated reality experiences (e.g., augmented and/or virtual reality), any other suitable wearable device, and combinations thereof.

Further, system or device 1100 can be implemented in a server computer system, such as a dedicated server or on shared hardware that implements a cloud-based service 1170. System or device 1100 can be implemented in other electronic devices, such as a home electronic device 1180 that includes a refrigerator, a thermostat, a security camera, and other suitable home electronic devices. The interconnection of such devices can be referred to as the "Internet of Things" (IoT). System or device 1100 can also be implemented in various modes of transportation 1190, such as part of a vehicle's control system, guidance system, and/or entertainment system.

The systems and devices illustrated in FIG. 11 are merely examples and are not intended to limit future applications of the disclosed embodiments. Other example systems and devices that can implement the disclosed embodiments include portable gaming devices, music players, data storage devices, and unmanned aerial vehicles.

It is to be appreciated that the Detailed Description section, and not the Abstract section, is intended to be used to interpret the claims. The Abstract section may set forth one or more but not all possible embodiments of the present disclosure as contemplated by the inventor(s), and thus, are not intended to limit the subjoined claims in any way.

Unless stated otherwise, the specific embodiments are not intended to limit the scope of claims that are drafted based on this disclosure to the disclosed forms, even where only a single example is described with respect to a particular feature. The disclosed embodiments are thus intended to be illustrative rather than restrictive, absent any statements to the contrary. The application is intended to cover such alternatives, modifications, and equivalents that would be apparent to a person skilled in the art having the benefit of this disclosure.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. An apparatus, comprising:

a load circuit configured to draw a first current;

a sense resistor configured to provide a voltage based on the first current; and a current compensation circuit configured to generate a second current based on the voltage, wherein the second current is drawn away from the load circuit, and wherein the current compensation circuit comprises an amplifier circuit having a first input connected to a first terminal of the sense resistor and a second input connected to a second terminal of the sense resistor.

2. The apparatus of claim 1, further comprising:

a mid-frequency noise suppression filter circuit electrically connected to a circuit node between the sense resistor and the load circuit; and a high-frequency noise suppression filter circuit electrically connected to the circuit node.

3. The apparatus of claim 2, wherein the mid-frequency noise suppression filter circuit comprises:

a transconductance circuit; and a capacitor electrically connected to the transconductance circuit in a parallel arrangement.

4. The apparatus of claim 2, wherein the high-frequency noise suppression filter circuit comprises a decoupling capacitor.

5. The apparatus of claim 1, wherein the current compensation circuit further comprises:

a voltage reference generator electrically connected to the first terminal of the sense resistor and to the first input of the amplifier circuit;

a transistor with a gate terminal electrically connected to an output of the amplifier circuit and a source/drain terminal electrically connected to the second terminal of the sense resistor.

6. The apparatus of claim 5, wherein the voltage reference generator comprises:

a reference resistor; and an adjustable current source electrically connected to the reference resistor and configured to generate a reference current.

7. The apparatus of claim 1, wherein the current compensation circuit further comprises a voltage reference generator electrically connected to the first terminal of the sense resistor and to the first input of the amplifier circuit.

8. The apparatus of claim 1, wherein the current compensation circuit further comprises a transistor with a gate terminal electrically connected to an output of the amplifier circuit and a source/drain terminal electrically connected to the second terminal of the sense resistor.

9. The apparatus of claim 1, further comprising a noise suppression filter circuit electrically connect to the sense resistor.

10. A system, comprising:

a power distribution network configured to provide a supply voltage;

a circuit electrically connected to the power distribution network and configured to receive the supply voltage; and a noise cancellation circuit between the power distribution network and the circuit, wherein the noise cancellation circuit is configured to generate a compensation current drawn away from the power distribution network by the circuit, wherein the noise cancellation circuit comprises:

a sense resistor comprising a first terminal and a second terminal; and an amplifier circuit comprising a first input connected to the first terminal of the sense resistor and a second input connected to the second input of the sense resistor.

11. The system of claim 10, wherein the noise cancellation circuit is further configured to suppress noise over a first frequency range.

12. The system of claim 11, further comprising:

a mid-frequency noise suppression filter circuit configured to suppress noise over a second frequency range lower than the first frequency range; and a high-frequency noise suppression filter circuit configured to suppress noise over a third frequency range higher than the second frequency range.

13. The system of claim 12, wherein the noise cancellation circuit and the high-frequency noise suppression filter circuits are configured to operate with noise suppression levels higher than that of the mid-frequency noise suppression filter circuit.

14. The system of claim 10, wherein the transconductance circuit noise cancellation circuit further comprises:

a voltage reference generator electrically connected to the amplifier circuit and to the sense resistor; and a transistor electrically connected to the amplifier circuit and to the sense resistor.

15. The system of claim 14, wherein the voltage reference generator comprises:

a reference resistor; and an adjustable current source electrically connected to the reference resistor.

16. A method, comprising:

drawing, with a load circuit, a load current from a power distribution network;

providing a voltage based on the load current flowing through a sense resistor;

generating a compensation current based on the voltage being received by a current compensation circuit that comprises an amplifier circuit having a first input connected to a first terminal of the sense resistor and a second input connected to a second terminal of the sense resistor; and setting a current level of the power distribution network substantially equal to a summation of the load current and the compensation current.

17. The method of claim 16, further comprising:

suppressing a noise at a first noise suppression level for a first frequency range;

suppressing the noise at a second noise suppression level for a second frequency range lower than the first frequency range; and suppressing the noise at a third noise suppression level for a third frequency range higher than the second frequency range, wherein the first and third noise suppression levels are higher than the second noise suppression level.

18. The method of claim 16, wherein generating the compensation current comprises controlling a gate terminal of a transistor based on an output of the amplifier circuit.

19. The method of claim 16, wherein generating the compensation current comprises calibrating a bleed current in a noise cancellation circuit.

20. The method of claim 19, wherein generating the bleed current comprises:

setting the load circuit to a peak current;

setting an adjustable current source to a first current;

measuring one or more voltages in the noise cancellation circuit at the first current;

setting the adjustable current source to a second current;

measuring one or more voltages in the noise cancellation circuit at the second current; and setting an operating current of the adjustable current source based on the one more voltages measurements from the noise cancellation circuit.

* * * * *